United States Patent [19]

dos Santos Pereina Ribeiro

[11] Patent Number: 4,883,574
[45] Date of Patent: Nov. 28, 1989

[54] METHOD FOR APPLYING COATINGS TO OBJECTS BY MEANS OF MAGNETIC FIELD SUPPORTED REACTIVE CATHODE SPUTTERING

[75] Inventor: Carlos A. S. P. dos Santos Pereina Ribeiro, Albstadt, Fed. Rep. of Germany

[73] Assignee: hartec Gesellschaft fur Hartstoffe und Dunnschichttechnik mbH & Co. KG, Stetten an kalten Markt, Fed. Rep. of Germany

[21] Appl. No.: 226,731

[22] Filed: Aug. 1, 1988

[30] Foreign Application Priority Data

Aug. 11, 1987 [DE] Fed. Rep. of Germany ....... 3726731

[51] Int. Cl.⁴ .............................................. C23C 14/34
[52] U.S. Cl. ........................... 204/192.15; 204/192.16; 204/192.17
[58] Field of Search .......... 204/192.12, 192.15–192.17

[56] References Cited

U.S. PATENT DOCUMENTS

| 4,384,933 | 5/1983 | Takasaki | 204/192.25 |
| 4,428,811 | 1/1984 | Sproul et al. | 204/192.13 |
| 4,702,967 | 10/1987 | Black et al. | 428/620 |

FOREIGN PATENT DOCUMENTS 146757 3/1981 German Democratic Rep. ............................. 204/192.12

OTHER PUBLICATIONS

A. Mumtaz et al., *J. Vac. Sci. Technol.*, vol. 20, pp. 345–348, (1982).
R. McMahon et al., *J. Vac. Sci Technol*, vol. 20, pp. 376–378, (1982).

*Primary Examiner*—Aaron Weisstuch
*Attorney, Agent, or Firm*—Nies, Webner, Kurz & Bergert

[57] ABSTRACT

A method is described for applying coatings to objects by means of magnetic field supported cathode sputtering in a vacuum, wherein, in order to achieve an improved coating rate, the total reactive gas quantity fed into a coating chamber is so measured that the reactive gas portion in the metal-reactive gas compound of the coating on the workpiece, is present in sub-stoichiometric relationship, and wherein the reactive gas flow in the chamber is conducted directly into the area of the workpieces to be coated, by-passing the sputtering cathode.

14 Claims, 1 Drawing Sheet

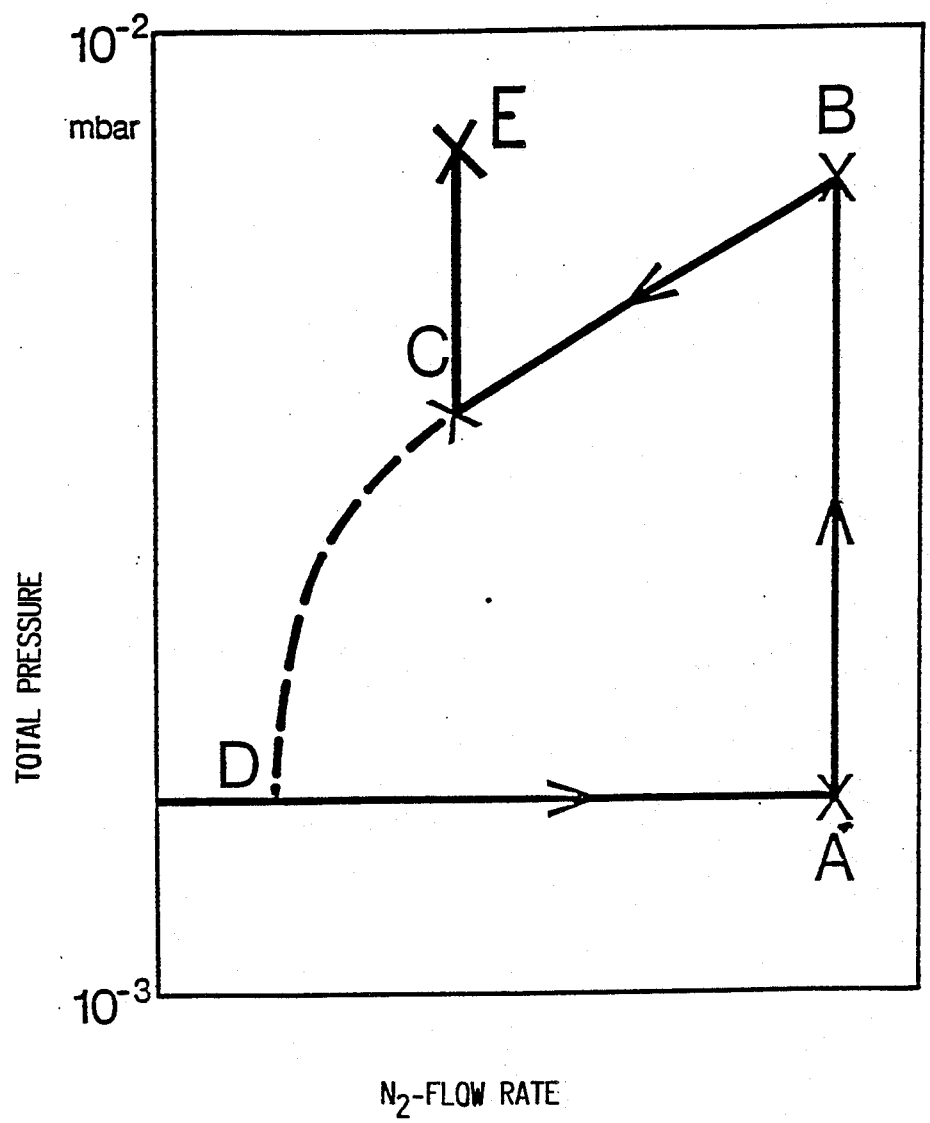

METHOD FOR APPLYING COATINGS TO OBJECTS BY MEANS OF MAGNETIC FIELD SUPPORTED REACTIVE CATHODE SPUTTERING

The invention refers to a method for applying coatings to objects of various types as elaborated on below.

Today there are various vacuum coating methods available for the coating of various types of objects. The magnetic field supported cathode sputtering mentioned above is one of these methods which has increasingly gained in economic significance over the past years.

The most commonly applied version of cathode sputtering is the reactive magnetron sputtering. This method is particularly used to provide workpieces with gold-like coatings of titanium nitride. This gold-like color is achieved in that the titanium and nitrogen portions of the compounds forming the coatings are in a stoichiometric relationship with each other. For this purpose it is necessary that the reactive gas portion in the coating chamber atmosphere, this being the nitrogen fed into the chamber, be in excess. In other words, the atmosphere in the coating chamber also contains—in addition to inert gas partial pressure which is required for maintaining the glow discharge necessary for the sputtering of the target material—a nitrogen partial pressure.

It is disadvantageous in the reactive magnetron sputtering that the erosion zone of the target surface be covered with compounds of metal and reactive gas atoms, which results in a drastic reduction in the sputtering rate, as these compounds, under comparable process conditions, result in a considerably lower sputtering yield (number of the sputtered metal particles per incident reactive gas ion).

The invention is based on the object of further developing the cathode sputtering method initially described above, and improving it in order to considerably increase the sputtering yield and thus also the coating rate as opposed to the methods known in the prior art.

A primary object is attained in accordance with the characteristic features of the invention. It is therefore intended according to the invention, to fill the coating chamber continuously with reactive gas, wherein the quantity of the gas is measured in such a way that the reactive gas portion in the metal-reactive gas compound forming the coating on the workpieces, is in substoichiometric relationship. This means that the atmosphere of the coating chamber contains no reactive gas partial pressure, which means that the total pressure in the coating chamber is determined only by the inert gas partial pressure, because only the amount of reactive gas required for the production of the metal-reactive gas compound is fed into the coating chamber.

Furthermore, according to the invention, a special inputting of the reactive gas flow is provided, this being so that the reactive gas is fed into the coating chamber, by-passing the sputtering cathode, directly into the area of the workpieces to be coated. This results in that the target erosion zone out of which the metal atoms are sputtered, is free from metal-reactive gas compounds, so that in comparison to the methods according to prior art, where the erosion zones of the target surface are covered with these compounds, a considerably greater sputtering yield can be reached.

It is of decisive importance for the improved sputtering yield that there is no build-up of reactive gas partial pressure in the coating chamber. In other words, with the presence of a reactive gas partial pressure, despite the chosen flow configuration of the reactive gas according to the invention, it could not be prevented that a certain portion of this gas reaches the area directly above the target surface, where, in combination with sputtered metal, it would be precipitated on the erosion zone, resulting in a reduced sputtering yield.

Whereas with the process according to prior art, that is with the production of stoichiometric metal-reactive gas compounds, a sputtering yield of approx. 40% is regularly achieved, related to a sputtering of the same target material with non-reactive processing, the sputtering yield achievable with the method according to the invention—also related to a sputtering with non-reactive processing—amounts to 90%.

The sputtering yield with the method according to the invention is thus more than twice as high as with the methods according the prior art. If it is furthermore considered that the rate of flow of reactive gas—maintaining the substoichiometric relationship in the metal-reactive gas compound in favor of the metal portion according to the invention—can be increased proportional to the improved sputtering yield, it becomes clear that also the coating rate, when using the method according to the invention, can be more than doubled in comparison to the known methods.

A further advantage of the method according to the invention consists in that the improved sputtering yield and coating rate considerably increase the nucleation for the layer growth on the workpiece surface. The increased speed of layer growth has the effect that the layer structuring is particularly even, so that therefore the layer properties are basically isotropic in their distribution, which results in particular in that the internal stress in the layers built up on the workpiece surfaces is considerably reduced in comparison with the layers obtained using the known methods.

An advantageous further development of the method provides the introduction of the reactive gas into the coating chamber in an ionized state. As a result of this, the degree of ionization in the coating chamber is increased in favor of a more intensive space charge which favors the formation of the metal and reactive gas compounds. A further advantage consists in the fact that as a result of the increased space charge, the voltage applied to the sputtering cathode can be reduced without impairing the sputtering yield. Finally, as a result of the increased space charge density, also the plasma discharge on the target surface becomes considerably more stable. I.e. the more or less distinctive oscillating of the plasma in dependence of the process parameters and the geometry of the coating chamber is dampened to a large extent.

The output of the sputtering cathode plays an important role in the production of sub-stoichiometric layers in the sense of the method according to the invention. These layers for example, can only then be truly satisfactorily produced if the output related to the target erosion zone of the sputtering cathode is at least 10 Watt/cm$^2$. Advantageously however, this output should be set at more than 20 Watt/cm$^2$. Even better results are achieved with outputs of more than 30 Watt/cm$^2$.

Also, the inert gas partial pressure should be in the range of 1 to $10 \times 10^3$ mbar. The best results are achieved thereupon in the lower values of the pressure range, as a lower pressure corresponds to a greater average free path length of the particles in the coating chamber, which there again effects an increase in the coating rate in relationship to the sputtering rate, as the number of collisions between the particles on the path from the target to the workpiece decreases. Furthermore, as a result of the pressure being as low as possible, the nucleation for the layer growth on the surface of the workpieces is increased.

Advantageously, a negative bias voltage in the range of at least 50 Volts and preferably within the range of 100 to 150 Volts is applied to the workpieces. As a result of this, during the coating process, a certain sputtering of the coating is effected on the workpiece surface, through which poorly adhering particles are sputtered off again from the workpiece surface. The same advantageous effect can be achieved through applying an alternating voltage of high frequency of comparable intensity to the workpiece.

Pure metal is suitable as target material for the method according to the invention, as well as alloys of pure metal. For example, zirconium, hafnium, molybdenum, tungsten, and titanium can be advantageously used, as well as titanium-aluminum, titanium-tungsten, tungsten-molybdenum, and chrome-nickel alloys, for example for the production of titanium nitride or titanium carbide.

It is also possible to more or less freely choose the reactive gases to be advantageously used for the method according to the invention. Those coming into consideration are gases containing nitrogen, carbon, oxygen, boron, and silicon, as well as mixtures thereof, and mixtures with other gases, for example nitrogen with ethylene or carbon dioxide, boron and ethylene, acetylene and/or nitrogen, silane and acetylene and/or nitrogen. Boron and silicon are contained in gases such as, respectively, diborane and silane.

The thus resulting types of coatings on the workpieces, when using the method according to the invention, are then more or less innumerable, as for example titanium aluminium oxynitride, titanium tungsten silicon carbide, and tungsten molybdenbum carbonitride.

Advantageous uses of the method according to the invention refer to the coating of tools, for example twist drills, screw taps, dies, milling cutters, indexable inserts, reamers, punches, and die plates. As a result of such tools made of high speed steel or hard metal being coated according to the invention, their wear resistance and/or resistance to corrosion is considerably increased.

Similar advantages are also achieved with the coating according to the invention on machine parts, such as thread plates, shafts, gears, bearings, guide parts, collet chucks, nuts, and bolts.

The method according to the invention is, however also advantageously suited for the coating of mechanically resistant material on articles of daily use, in particular for improving their service life as well as their finish properties. Such articles are for example: tips of ink drawing tubes or tips of ball-point pens, writing equipment, watch housings, frames for glasses, bracelets, door handles, appliances for surgical medicine, as well as all types of articles made of glass, plastic, or ceramic materials.

Further advantages which can be achieved using the method according to the invention are described in greater detail in the following description using the drawing.

The single FIGURE of the drawing shows a diagram giving the relationship between total gas pressure in the coating chamber and the reactive gas rate of flow (here nitrogen) with constant inert gas partial pressure.

The straight line between points D and A corresponds to the inert gas partial pressure which, both in the known methods and in the method according to the invention, is kept constant, and corresponds to the total pressure in the coating chamber.

In the production of stoichiometric titanium nitride compounds according to the methods of the prior art, the nitrogen partial pressure in the coating chamber is already present when the sputtering cathode is activated. The size of this partial pressure corresponds to the point E in the diagram. As the titanium nitride compound is produced, nitrogen is continuously consumer, the total pressure in the chamber drops to point C, despite the set constant flow of nitrogen. The nitrogen partial pressure in the chamber then corresponds to the vertical coordinate component of the distance between point C and D. The known methods are operated with this constant nitrogen partial pressure in addition to the inert gas partial pressure.

In the production of sub-stoichiometric titanium nitride compounds according to the method of the invention, the sputtering cathode is switched on prior to or simultaneously with the flow of nitrogen so that no nitridation of the target erosion zone can take place. The nitrogen flow is started at low rate, then continuously increased and finally adjusted to a value between points D and A, the connecting straight line of which corresponds to the constant inert gas partial pressure, so that in the atmosphere in the coating chamber, there can be no build-up of a nitrogen partial pressure, although the nitrogen rate of flow is considerably greater than with the methods according to the prior art.

Using the diagram of FIG. 1 it will now be described how the method according to the invention can be simply modified for the production of multiple layers, for example for applying an additional layer which contains a deficit of metal portions.

If, contrary to the specifications for the method according to the invention, the nitrogen rate of flow is either allowed to reach the point A or if the output of the sputtering cathode is reduced, corresponding to a displacement to the left of the straight lines through points A and B in the diagram, in the direction of a lower nitrogen rate of flow, the target erosion zone is covered with titanium nitride compounds. In order to remove this precipitation on the erosion zone, the nitrogen rate of flow must be reduced until point D is reached. If, on the other hand, the nitrogen rate of flow is kept constant, then the atmosphere in the coating chamber is made up of—in addition to the inert gas partial pressure—a nitrogen partial pressure, corresponding to the difference between the points B and A, as a result of which super-stoichiometric titanium nitride compounds with a metal deficit are produced.

In this manner it is possible to apply multiple layers to the workpieces in a simple manner, without having to interrupt the coating process, which complement each other in their various properties. For example, in order to fulfil a functional purpose, such as an increase in resistance against corrosion, a sub-stoichiometric layer, that is, a layer with excess metal, can be applied to the workpiece surfaces and then a super-stoichiometric layer can be applied which contains a deficit in metal and having better finish properties than the first layer.

Measurements carried out on the coatings on tools produced in sub-stoichiometric form, according to the invention, thus with excess metal, surprisingly showed that the layer hardness is comparable to those of stoichiometric coatings produced with the known methods. Whereas the latter are limited to layer thicknesses of up to a maximum of 3 $\mu$m due to their relatively low tenacity and the occurring layer stress, with the method according to the invention, workpieces can also be coated with layer thickness of up to 6 $\mu$m without difficulty.

The method according to the invention thus permits a large variation in the chemical composition and the thickness of the layers, so that the layer properties can be optimally adapted to the specific use. This, in addition to the increase in economic efficiency of the method according to the invention, is one of the most significant advantages over the known coating methods.

What we claim is:

1. Method for applying coatings to objects by means of magnetic field supported cathode sputtering in a vacuum, wherein in order to maintain the glow discharge necessary for the sputtering of the target material, the method includes the steps wherein an inert gas is continuously fed into the coating chamber and, with the aid of a vacuum pump, is continuously pumped out of the coating chamber in such a way that a constant inert gas partial pressure is maintained in the coating chamber, and the step wherein at least one reactive gas is fed into the coating chamber, which forms a compound with the sputtered metallic target material, with which the workpieces are coated, characterized in that the total quantity of reactive gas continuously fed into the coating chamber is so chosen that the reactive gas component of the metal-reactive gas compound of the coating is in sub-stoichiometric relationship and there is no build up of reactive gas partial pressure, and that the step of feeding reactive gas into the coating chamber conducts the reactive gas flow directly into the space between the sputtering cathode and the workpieces to be coated, by-passing the sputtering cathode.

2. Method according to claim 1, characterized in that the sputtering of the target material of the sputtering cathode is commenced prior to the introduction of reactive gas and that the quantity of reactive gas fed into the coating chamber is slowly increased to the desired final value.

3. Method according to claim 1, characterized in that the reactive gas is fed into the coating chamber via a gas distributing system, directly onto the workpiece surfaces.

4. Method according to claim 1 characterized in that the reactive gas is introduced in ionized state into the coating chamber.

5. Method according to claim 1, characterized in that the output of the sputtering cathode target erosion zone is at least 10 Watt/cm$^2$.

6. Method according to claim 5, characterized in that the inert gas partial pressure forming the total pressure in the coating chamber is between 1 and $10 \times 10^{-3}$ mbar.

7. Method according to claim 5, characterized in that a bias voltage is applied to the workpieces.

8. Method according to claim 7, characterized in that the bias voltage is a negative voltage with an amount of at least 50 Volts.

9. Method according to claim 7, characterized in that the bias voltage is an alternating voltage of high frequency.

10. Method according to claim 7, characterized in that the bias voltage is a negative voltage with an amount within the range of 100 to 150 volts.

11. Method according to claim 1, characterized in that the target material is a pure metal, chosen from zirconium, hafnium, molybdenum, tungsten, titanium, or an alloy of pure metals, chosen from a titanium-aluminum, titanium-tungsten, tungsten-molybdenum or a chrome-nickel alloy, and that the reactive gas is a mixture of gases containing at least one of nitrogen, carbon, oxygen, boron, and silicon.

12. Method according to claim 1, characterized in that subsequently, on top of the application of a coating with a sub-stoichiometric reactive gas compound, a further coating with a super-stoichiometric reactive gas compound is applied to the first coating.

13. Method according to claim 1, characterized in that the sputtering of the target material of the sputtering cathode is commenced simultaneously with the introduction of reactive gas and that the quantity of reactive gas fed into the coating chamber is slowly increased to the desired final value.

14. Method according to claim 1, characterized in that the output of the sputtering cathode target erosion zone is preferably 30 Watt/cm$^2$ or greater.

* * * * *

UNITED STATES PATENT AND TRADEMARK OFFICE
CERTIFICATE OF CORRECTION

PATENT NO. : 4,883,574
DATED : November 28, 1989
INVENTOR(S) : Carlos A. dos Santos Pereira Ribeiro It is certified that error appears in the above-identified patent and that said Letters Patent is hereby corrected as shown below:

<u>ON THE COVER SHEET</u>:

Column 1, in item (75) the Inventor's name should read

-- Carlos A. dos Santos Pereira Ribeiro --.

Column 4, line 16, "consumer" should read --consumed--.

Signed and Sealed this

Sixth Day of November, 1990

*Attest:*

HARRY F. MANBECK, JR.

*Attesting Officer*     *Commissioner of Patents and Trademarks*